United States Patent [19]
Kondo

[11] Patent Number: 5,851,723
[45] Date of Patent: Dec. 22, 1998

[54] PROCESS FOR MAKING LITHOGRAPHIC PRINTING PLATE

[75] Inventor: Toshiro Kondo, Tokyo, Japan

[73] Assignee: Mitsubishi Paper Mills Limited, Tokyo, Japan

[21] Appl. No.: 914,184

[22] Filed: Aug. 19, 1997

[30] Foreign Application Priority Data

Aug. 19, 1996 [JP] Japan ................................ 8-217129

[51] Int. Cl.$^6$ .............. G03C 8/06; G03C 5/39; G03F 7/07
[52] U.S. Cl. ............ 430/204; 430/248; 430/488; 430/491
[58] Field of Search ................... 430/204, 248, 430/488, 491

[56] References Cited

U.S. PATENT DOCUMENTS

5,496,679  3/1996  Hauquier et al. ................ 430/204

*Primary Examiner*—Richard L. Schilling
*Attorney, Agent, or Firm*—Cushman, Darby & Cushman, IP Group of Pillsbury, Madison & Sutro

[57] ABSTRACT

Disclosed is a process for making a lithographic printing plate which utilizes the silver complex diffusion transfer process by subjecting the lithographic printing plate to exposure and then development processing and optionally stabilizing processing, which comprises performing the development processing/the stabilizing processing by using a developing solution/a stabilizing solution each containing a monothioether compound containing succinic acid, a salt thereof or a derivative thereof.

27 Claims, 1 Drawing Sheet

PROCESS FOR MAKING LITHOGRAPHIC PRINTING PLATE

BACKGROUND OF THE INVENTION

This invention relates to a process for making a lithographic printing plate utilizing the silver complex diffusion transfer process, by using a solution to be used for developing the lithographic printing plate or neutralizing and stabilizing it.

There have already been known lithographic printing plates in which a transferred silver image obtained by the silver complex diffusion transfer process (the DTR process) can be utilized immediately as ink receptivity. For example, lithographic printing plates having an undercoat layer, a silver halide emulsion layer and a physical development nuclei layer provided on a support have been described in U.S. Pat. Nos. 3,721,559, 3,490,905, 3,385,701, 3,814,603, 3,454,398, 3,764,323 and 3,099,209, Japanese Patent Publications No. 27242/1969 and No. 30562/1973, and Japanese Provisional Patent Publications No. 9603/1978, No. 21602/1978, No. 103104/1979 and No. 9750/1981. Also, lithographic printing plates having a silver halide emulsion layer on physical development nuclei carried on an aluminum support have been described in Japanese Provisional Patent Publications No. 216236/1993 and No. 81194/1994.

According to one practical process for making such a lithographic printing plate, when a photosensitive material comprising a support and an undercoat layer which also serves as a halation preventive layer, a silver halide emulsion layer and a physical development nuclei layer provided thereon is subjected to image exposure and development processing, silver halide on which a latent image is formed becomes blackened silver in an emulsion. Simultaneously, silver halide on which a latent image is not formed is dissolved by the action of a silver halide solvent contained in a development processing solution to be diffused to the surface of the photosensitive material. A dissolved and diffused silver complex is precipitated as image silver on physical development nuclei of the surface layer by the reducing action of a developing agent.

As a process for making the above lithographic printing plate, development processing and neutralizing (stabilizing) processing are generally carried out after exposure. In the step of development processing, a silver complex dissolved by a silver halide solvent is dissolved out in a developing solution and reduced to be precipitated as metallic silver, whereby silver sludge is formed. After development processing, a silver complex remaining on a plate surface is precipitated by a neutralizing solution used in the next step, whereby sliver sludge is also formed.

These silver sludges are increased by running processing to lower printing characteristics.

On the other hand, in a process for making the lithographic printing plate having physical development nuclei on an aluminum support and having a silver halide emulsion layer on the physical development nuclei described above, development processing and water washing processing (washing off: processing for removing a silver halide emulsion layer) are generally carried out after exposure. In this plate making process, stabilizing processing may be carried out, but it is omitted in practice. Even in this plate making process, there is a problem of precipitation of silver sludge in a developing solution as described above.

On the other hand, in order to strengthen the ink receptivity of a silver image obtained, it has generally been carried out to make a water-insoluble compound (an oleophilic property-imparting agent) having a mercapto group or a thione group act on the silver image, which has been described in Japanese Patent Publication No. 29723/1973 and Japanese Provisional Patent Publication No. 127928/1983. Further, it has been also carried out to make the above oleophilic property-imparting agent act at the time of plate making.

It has been found that the above oleophilic property-imparting agent promotes generation of silver sludge in a developing solution and a neutralizing solution (a stabilizing solution). Particularly when the pH on a plate surface is lowered by a neutralizing solution, if the oleophilic property-imparting agent is coordinated to a silver complex or a silver ion, precipitation thereof is remarkably increased.

On the other hand, as a development processing system used for plate making, a dipping processing system in which a large amount of a processing solution is stored in a tank has generally been used in the prior art. However, in recent years, a measure to solve an environmental problem (reduction of the amount of a waste liquid), improvement in maintenance of a processing apparatus and so on have been demanded, and a coating processing system in which processing can be carried out with a small amount of a processing solution has been developed.

In this coating processing system, a processing solution is coated on a photosensitive surface of a photosensitive material with a necessary amount for processing. The coating processing system is described in, for example, Japanese Provisional Patent Publications No. 76603/1973 and No. 307245/1992, U.S. Pat. No. 5,398,092 and WO 95/18400.

The coating processing system described in detail below is mainly different from a conventional tank developing system in the following points. The coating processing system is different in that an intermediate tank for storing a processing solution is small (since the amount of a processing solution to be used is small, an apparatus can be made compact); a processing solution coated on a plate surface is maintained for a certain period of time to maintain a reaction; and prior to coating, an amount more than a coating amount of a processing solution is once fed on a plate surface, and an excess amount of the processing solution removed by a coating roller is recovered and used again. These characteristic points undesirably facilitate generation of silver sludge as compared with the conventional tank developing system.

In the field to which the silver complex diffusion transfer process is applied, a method of incorporating a quaternary ammonium salt into a developing solution has been disclosed as a technique of suppressing generation of silver sludge, in Japanese Provisional Patent Publication No. 157738/1980. When this method is applied to a DTR printing plate, it has a drawback that printing characteristics are lowered, particularly background toning and partial inking failure are caused.

Also, a large number of techniques have been reported in the field of common photographic photosensitive materials. For example, a mercapto compound, a disulfide compound and so on have been known. However, most of these silver sludge-preventing agents have drawbacks that they suppress physical development and inhibit printing characteristics necessary for a lithographic printing plate, particularly ink receptivity. Therefore, the above silver sludge-preventing agents cannot be applied to processing of the lithographic printing plate which is the target of the present invention.

SUMMARY OF THE INVENTION

An object of the present invention is to provide a process for making a lithographic printing plate utilizing the silver complex diffusion transfer process, by using a solution to be used for developing the lithographic printing plate or neutralizing and stabilizing it after development, i.e., a developing solution or a neutralizing and stabilizing solution (hereinafter referred to as "a stabilizing solution"), which prevents generation of silver sludge and retains stable printing characteristics even in running processing without suppressing physical development and inhibiting ink receptivity. Another object of the present invention is to prevent generation of silver sludge in a coating processing system.

The above objects of the present invention have been achieved by the following method: in a process for making a lithographic printing plate utilizing the silver complex diffusion transfer process by subjecting the lithographic printing plate to exposure and then development processing, the improvement comprises:

performing the development processing by using a developing solution containing a monothioether compound containing succinic acid, a salt thereof or a derivative thereof.

Particularly when a coating processing system is used in developing and stabilizing (or neutralizing) processings, the effects of the present invention exhibit remarkably.

In processing of the lithographic printing plate which is the target of the present invention, the most difficult and most characteristic points are to prevent silver sludge without suppressing physical development and inhibiting the ink receptivity of a resulting silver image.

The conventional silver sludge-preventing agents described above cannot satisfy the above requirements. That is, they have drawbacks that although silver sludge is prevented, physical development is suppressed, and the ink receptivity of a silver image is inhibited.

The present inventors have studied intensively and consequently found that the above monothioether compound can satisfy the above requirements, to accomplish the present invention.

It has been known to incorporate a thioether compound into a developing solution as a solvent of silver halide in development processing of a lithographic printing plate utilizing the silver complex diffusion transfer process, which has been disclosed in, for example, U.S. Pat. No. 5,200,294. However, it has not been known that the monothioether compound of the present invention prevents silver sludge without inhibiting printing characteristics.

DESCRIPTION OF THE PREFERRED EMBODIMENTS

In the following, the present invention is explained in detail.

The monothioether compound to be used in the present invention contains succinic acid, a salt thereof or a derivative thereof in its molecule.

If two or more thioether groups are contained, an action as a solvent of silver halide becomes strong, and an effect of preventing silver sludge is lost.

As the derivative of succinic acid, there may be mentioned an ester in which a hydrogen atom of a carboxy group is substituted, an amido group in which a hydroxyl group of the same is substituted, and an acid anhydride. The salt of succinic acid is not particularly limited, but may include an alkali metal salt such as Na and K, an ammonium salt and an amine salt.

As a group forming the ester, there may be mentioned an alkyl group and an aryl group, preferably a lower alkyl group having 1 to 4 carbon atoms. These groups may be substituted by an alkyl group or an alkylene oxide group (including a polyalkylene oxide group) such as an ethylene oxide group and a propylene oxide group. In that case, the number of alkylene oxide groups is preferably 2 or more such as a polyethylene oxide group and a polypropylene oxide group.

The amido group may be substituted or unsubstituted, but it is preferably an amido group substituted by an alkyl group having 1 to 4 carbon atoms.

A representative example of the monothioether compound to be used in the present invention is shown by the following formula (1).

wherein $A^1$ and $A^2$ each represent $OM^1$, $N(R^2R^3)$ or $OR^4$ where $M^1$ represents a cation such as a hydrogen atom, an alkali metal or an ammonium group, $R^2$ and $R^3$ each represent a hydrogen atom or an alkyl group having 1 to 4 carbon atoms, and $R^4$ represents an alkyl group having 1 to 6 carbon atoms (e.g., a methyl group, an ethyl group, a propyl group and a butyl group), a substituted alkyl group (e.g., an alkyl group substituted by an ethylene oxide group or a propylene oxide group), an aryl group (e.g., a phenyl group) or the like, or may be an acid anhydride in which two carboxy groups are dehydrated; L represents an alkylene group having 1 to 4 carbon atoms such as methylene and ethylene or a direct bond; n represents 0 or 1; and $R^1$ represents an unsubstituted alkyl group having 1 to 6 carbon atoms (e.g., a methyl group, an ethyl group, a propyl group and a butyl group) or a substituted alkyl group having 1 to 6 alkyl carbon atoms (e.g., an alkyl group substituted by a carboxy group or a salt thereof, an amido group, an alkoxycarbonyl group or a hydroxyl group).

It is preferred that $A^1$ and $A^2$ are $OM^1$, and $R^1$ is an alkyl group having 1 to 4 carbon atoms substituted by a carboxy group or a salt thereof. Specific examples of the monothioether compound to be used in the present invention are shown by the following formulae (2) to (14). However, the monothioether compound of the present invention is not limited by these examples.

-continued $$HO-CH_2CH_2-S-\underset{|}{CH}COOH \quad (7)$$
$$CH_2COOH$$

(8)

$$HOOC-CH_2CH_2-S-\underset{|}{CH}COOH \quad (9)$$
$$CH_2COO+CH_2CH_2O)_3CH_3$$

$$(C_2H_4OH)_3N.HOOC-CH_2CH_2-S-\underset{|}{CH}COOH.N(C_2H_4OH)_3 \quad (10)$$
$$CH_2COOH.N(C_2H_4OH)_3$$

$$NaOOC-CH_2CH_2-S-\underset{|}{CH}COOC_2H_5 \quad (11)$$
$$CH_2COOC_2H_5$$

$$C_2H_5OOC-CH_2CH_2-S-\underset{|}{CH}COONa \quad (12)$$
$$CH_2COONa$$

$$NaOOC-CH_2CH_2-S-\underset{|}{CH}CON(C_2H_5)_2 \quad (13)$$
$$CH_2CON(C_2H_5)_2$$

$$(C_2H_5)_2NOC-CH_2CH_2-S-\underset{|}{CH}CON(C_2H_5)_2 \quad (14)$$
$$CH_2CON(C_2H_5)_2$$

The amount of the above compound to be added to the developing solution and the stabilizing solution is $10^{-5}$ to $10^{-1}$ mole/liter, preferably $10^{-4}$ to $10^{-2}$ mole/liter. This compound has a characteristic that even when a relatively large amount thereof is used, other characteristics are not lowered, i.e., physical development is not suppressed, and the ink receptivity of a silver image is not inhibited.

The developing solution to be used in the present invention may contain, in addition to the above compound, an alkaline substance (e.g., sodium hydroxide, potassium hydroxide, lithium hydroxide and sodium tertiary phosphate), a preservative (e.g., a sulfite), a silver halide solvent (e.g., thiosulfate, thiocyanate, cyclic imide, thiosalicylic acid and a mesoionic compound), a viscosity modifier (e.g., hydroxymethyl cellulose and carboxymethyl cellulose), a developing agent (e.g., hydroquinone, 1-phenyl-3-pyrazolidone, Metol (p-methylaminophenol sulfate, trade name, available from Agfa Co.), catechol, pyrogallol and glycine), and a development modifier (e.g., a polyoxyalkylene compound and an onium compound).

In practicing the silver complex diffusion transfer process (the DTR process), as described in, for example, U.K. Patents No. 1,000,115, No. 1,012,476, No. 1,017,273 and No. 1,042,477, it has been carried out to mix a developing agent into a silver halide emulsion layer and/or an image-receiving layer, or other water-permeable layer adjacent thereto. Therefore, in such a material, the so-called "alkaline activating solution" containing no developing agent can be used as a processing solution to be used in adeveloping step.

In order to improve the ink receptivity of silver image portions, a compound having a mercapto group or a thione group as an oleophilic property-imparting agent is preferably incorporated into the developing solution or the stabilizing solution. As the compound having a mercapto group or a thione group, there may be mentioned, for example, compounds described in Japanese Patent Publication No. 29723/1973 and Japanese Provisional Patent Publication No. 127928/1983. Compounds having an oleophilic group such as an alkyl group, an aryl group and an alkenyl group are particularly preferred.

As a representative example of the compound having a mercapto group or a thione group, there may be mentioned a compound represented by the following formula (15):

(15)

wherein $R^1$ and $R^3$ each independently represent an alkyl group having 3 or more carbon atoms, preferably 3 to 12 carbon atoms, an alkenyl group having 3 or more carbon atoms, preferably 3 to 12 carbon atoms, an aralkyl group or an aryl group; $R^2$ represents a hydrogen atom, an alkyl group having 3 or more carbon atoms, preferably 3 to 12 carbon atoms, an alkenyl group having 3 or more carbon atoms, preferably 3 to 12 carbon atoms, an aralkyl group or an aryl group; m and n each represent an integer of 1 or more, and when $R^2$ is an alkyl group having 3 or more carbon atoms, an alkenyl group, an aralkyl group or an aryl group, n may be 0; and Z represents atomic groups necessary for forming a 5- or 6-membered ring together with N and C in the formula such as C, N, 0 and S.

As a specific example of the 5- or 6-membered heterocyclic ring, there may be mentioned imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine. The above heterocyclic ring may be a ring produced by condensing two or more rings such as bicyclic, tricyclic, etc. or may be condensed with a benzene ring or a naphthalene ring.

As a specific example of the compound having a mercapto group or a thione group, there may be mentioned 2-mercapto-4-phenylimidazole, 2-mercapto-1-benzylimidazole, 2-mercapto-1-butyl-benzimidazole, 1,3-dibenzyl-imidazolidine-2-thione, 2-mercapto-4-phenylthiazole, 3-butyl-benzothiazoline-2-thione, 3-dodecyl-benzothiazoline-2-thione, 2-mercapto-4,5-diphenyloxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 5-mercapto-1-phenyl-tetrazole, 3-mercapto-4-methyl-6-phenyl-pyridazine, 2-mercapto-5,6-diphenylpyrazine, 2-mercapto-4,6-diphenyl-1,3,5-triazine and 2-amino-4-mercapto-6-benzyl-1,3,5-triazine, but the compound having a mercapto group or a thione group is not limited thereby.

The amount of the compound having a mercapto group or a thione group to be used is 0.01 to 1 g, preferably 0.02 to 0.5 g based on 1 liter of the developing solution. If the amount to be used is large, physical development is suppressed.

In the present invention, the stabilizing solution to be used after development processing has roles of neutralizing and stabilizing pH on a plate surface. The stabilizing solution may be mixed with, in addition to the above monothioether compound, a buffer, a preservative, a wetting agent and a surfactant. As the buffer, an inorganic acid such as phosphoric acid and sulfuric acid or an organic acid such as succinic acid and propionic acid is used so that the pH is kept at 5 to 7. Further, a complexing agent such as iminodiacetic acid and ethylenediaminetetraacetic acid and inorganic particles such as colloidal silica may be contained in the stabilizing solution. Also, the above oleophilic property-imparting agent is preferably contained therein.

The above oleophilic property-imparting agent (the compound having a mercapto group or a thione group) is not dissolved in a neutral to weakly acidic (pH 5 to 7) stabilizing solution comprising water as a main component. Therefore, the oleophilic property-imparting agent is added by using, for example, a method of dissolving said agent in an alkaline solution to adjust pH, a method of dissolving said agent in an amine compound or a quaternary ammonium salt type cationic surfactant, a method of using an organic solvent or the like. The method of using an amine compound is preferred.

As the above amine compound, there may be mentioned, for example, amino alcohols such as monoethanolamine, diethanolamine, triethanolamine and aminoethylethanolamine, monoamines such as propylamine and butylamine, diamines such as dimethylaminoethylamine, polyamines such as N-aminopropylpropanediamine, and cyclic amines such as pyridine and piperidine, preferably amino alcohols. These amine compounds are available from Nippon Nyukazai Co., Japan, Koei Kagaku Kogyo Co., Japan and so on.

The amount of the oleophilic property-imparting agent to be used is 0.01 to 2 g, preferably 0.02 to 1 g based on 1 liter of the stabilizing solution (a solution to be used).

The amine compound is added so that the weight ratio of the amine compound to the oleophilic property-imparting agent is 5:1 to 100:1, preferably 10:1 to 50:1.

On the other hand, for plate making processing of a lithographic printing plate utilizing the silver complex diffusion transfer process, a processing system (tank processing) in which a lithographic printing plate is dipped in a large amount of a processing solution stored in a tank is generally used. However, in recent years, a coating processing system is being developed for the purpose of reducing the discharge amount of a processing solution.

The present invention is effective for achieving the object of preventing generation of silver sludge without inhibiting the ink receptivity of silver image portions even by using either of the above processing systems. However, particularly in the coating processing system, the amount of a processing solution to be used is limited so that silver sludge is easily generated, and the present invention is suitably used in the coating processing system.

The coating processing system in the present invention is a system in which a processing solution is coated and fed on the surface of a lithographic printing plate. As a coating system, there may be mentioned a roller coating system, a liquid-elevating coating system, a roller coating system by dropwise addition, a knife coating system by dropwise addition, a spray coating system and a brush coating system, which are described in, for example, Japanese Provisional Patent Publications No. 76603/1973, No. 237455/1987, No. 307245/1992, No. 27682/1994 and No. 175219/1995. Among these systems, a roller coating system using a wire bar or the like is particularly preferred since a predetermined coating amount can be weighed.

Figure 1:
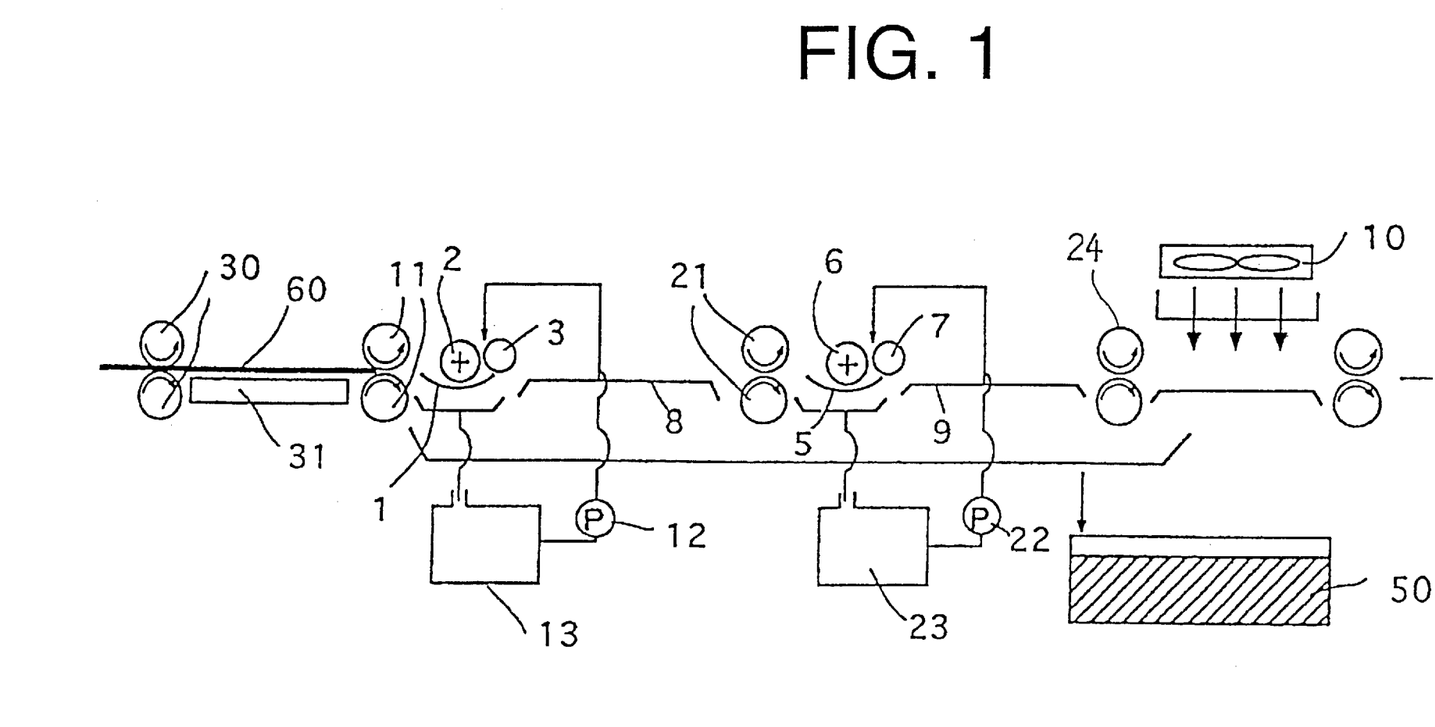
FIG. 1 is a schematic sectional view showing one embodiment of a developing apparatus using a coating processing system.

A preferred embodiment of the coating processing system to be used in the present invention is explained in detail by referring to FIG. 1. FIG. 1 is a schematic sectional view of a whole automatic developing apparatus using the coating processing system. The automatic developing apparatus of FIG. 1 is roughly constituted by a heating part, a development processing part, a stabilizing processing part and a drying part of a lithographic printing material.

A lithographic printing material heated to a predetermined temperature by a heating means (31) is processed at the development processing part and the stabilizing processing part and then dried at a drying portion (10). The development processing part is mainly constituted by a pair of lithographic printing material-conveying rollers (11), a developing solution-coating portion (1), a reaction-maintaining portion (8), a developing solution-circulating pump (12) and a developing solution intermediate tank (13).

The stabilizing processing part has the same constitution as that of the development processing part and is constituted by a pair of lithographic printing material-conveying rollers (21), a stabilizing solution-coating portion (5), a reaction-maintaining portion (9), a stabilizing solution-circulating pump (22) and a stabilizing solution intermediate tank (23). A pair of the lithographic printing material-conveying rollers (21) also serve as squeezing rollers which squeeze a developing solution retained on a plate surface at the reaction-maintaining portion (8).

In the coating portions (1) and (5), the dipping coating system described in Japanese Provisional Patent Publication No. 175219/1995 is used. By a coating roller (3) or (7) (a wire bar), the processing solution is weighed and coated. As another preferred coating system, there may be used a pair of coating rollers as described in Japanese Provisional Patent Publications No. 237455/1987 and No. 27682/1994. In that case, the processing solution is fed from a feeding means (a slit, a nozzle or the like) to the coating rollers, and fed and coated on a plate surface through said rollers.

The processing solution stored in the processing solution intermediate tank (13) or (23) is fed between the coating roller (3) or (7) and a guide roller (2) or (6) by a pump, respectively. In order that the processing solution is coated uniformly and stably, the amount of the processing solution to be fed is set so that said amount is larger than a coating amount (an amount of the processing solution taken out by being weighed and coated by the coating roller). Such an excess amount of the processing solution is recovered, returned to the intermediate tank and used again.

The amount of the processing solution to be coated is 10 to 100 ml/m$^2$, preferably 20 to 60 ml/m$^2$. After the processing solution is coated, in order to maintain a reaction of a photosensitive layer and the processing solution, a step of retaining the processing solution on a plate surface for a certain period of time (about 3 to 10 seconds) is provided. Thereafter, the processing solution on the plate surface is squeezed and removed by the squeezing rollers (21) or (24). The squeezed processing solution is discharged to a discharge tank (50).

The object of the coating processing system is to reduce the discharge amount of a processing solution as far as possible. As described above, an excess amount of the processing solution fed on the plate surface prior to coating, which is removed by the coating roller, is recovered and used again. However, when the processing solution once fed on the plate surface is recovered and used again, a reaction proceeds slightly in the recovered processing solution so that a silver complex which generates silver sludge exists. The silver complex is increased by running processing and precipitated as silver sludge.

Particularly in the stabilizing processing step, this phenomenon occurs remarkably. That is, the developing solution is coated on the plate surface; after the reaction-maintaining step, the developing solution on the plate surface is removed by the squeezing rollers; and then a stabilizing solution is fed. The developing solution is not completely removed from the plate surface, a silver complex exists in the remaining developing solution, and the silver complex is recovered together with an excess amount of the stabilizing solution and precipitated as silver sludge.

In the processing apparatus using the coating processing system, in order that the processing apparatus is made compact, the volume of the intermediate tank for storing the processing solution is designed to be considerably small (about 0.5 to 2.0 ) as compared with a conventional tank developing type apparatus (dipping processing), whereby silver sludge is easily generated.

Also, adhesion of silver sludge to the squeezing rollers after the reaction-maintaining step is a serious problem. In the reaction-maintaining step, a reaction proceeds sufficiently on the plate surface, a silver complex dissolved out in the developing solution remains on the plate surface and is adhered to the squeezing rollers to be precipitated as silver sludge. When the amount of silver sludge adhered to the squeezing rollers is large, silver sludge is transferred onto the surface of a processed lithographic printing plate, whereby the quality such as ink receptivity of the plate is remarkably lowered.

Therefore, a problem of silver sludge in the coating processing system is serious, and the present invention is an extremely significant technique in the point of solving such a problem.

The lithographic printing plate utilizing the silver complex diffusion transfer process, which is the target of the present invention, includes a lithographic printing plate having an undercoat layer which also serves as a halation preventive layer, a silver halide emulsion layer and a physical development nuclei layer provided on a support as described above, and a lithographic printing plate having a silver halide emulsion layer on physical development nuclei carried on an aluminum support as described in Japanese Provisional Patent Publications No. 216236/1993 and No. 81194/1994.

In a process for making the former lithographic printing plate, development processing and stabilizing processing are generally carried out after exposure. In a process for making the latter lithographic printing plate, development processing and water washing processing (removal of a silver halide emulsion layer) are generally carried out after exposure, and stabilizing processing is not generally carried out.

As a silver halide emulsion of the lithographic printing plate to be used for practicing the present invention, there may be used silver chloride, silver bromide, silver chlorobromide, silver chloroiodide and silver chlorobromoiodide, preferably silver halide comprising 50 mole % or more of silver chloride. The above silver halide may contain a spectrally sensitizing agent (a spectrally sensitizing dye depending on a light source and use, for example, a spectrally sensitizing dye of camera type, laser beam type or panchromatic type for color separation), a gelatin-curing agent, a coating aid, an antifoggant, a plasticizer, a developer and a matting agent.

As a binder of the silver halide emulsion, there may be used natural and/or synthetic binders generally used for this purpose, for example, gelatin, colloidal albumin and a cellulose derivative.

At the lower side (at a support side) of the silver halide emulsion layer, a subbing layer for improving adhesion and/or an undercoat layer for the purpose of preventing halation and so on may be provided, and a developer and a matting agent may be contained in these layers.

As a support on which the silver halide emulsion is to be coated, there may be used paper, various films, plastics, paper coated with a resinous material and a metal.

With respect to physical development nuclei to be used in the physical development nuclei layer, examples of this kind of chemicals have been known, and there may be used metals such as antimony, bismuth, cadmium, cobalt, palladium, nickel, silver, lead and zinc, and sulfides thereof. In the physical development nuclei layer, a developer may be also contained, and a water-soluble binder may be contained.

The lithographic printing plate prepared by the present invention can be made ink receptive, or the ink receptivity thereof can be increased by a compound as described in, for example, Japanese Patent Publication No. 29723/1973 and U.S. Pat. No. 3,721,539.

As a printing method, a non-oil sensitivity-imparting solution, damping water and so on, generally known ones may be used.

EXAMPLES

The present invention is described in detail by referring to Examples, but the present invention is not limited by these Examples as a matter of course.

Example 1

As a lithographic printing plate utilizing the silver complex diffusion transfer process, on one surface of each polyester film support subjected to subbing treatment, a matting layer containing silica particles having an average particle size of 5 $\mu$m was provided, and on the other surface of the support, a halation-preventing undercoat layer (adjusted to pH 4) containing carbon black and silica powder having an average particle size of 3.5 $\mu$m in an amount of 20% by weight based on the amount of photographic gelatin, and a high sensitivity silver chloride emulsion layer (adjusted to pH 4) containing silica powder having an average particle size of 3.5 $\mu$m in an amount of 5% by weight based on the amount of photographic gelatin, which was chemically sensitized and then spectrally sensitized to a green-sensitive region were provided.

The gelatin of the undercoat layer was coated in an amount of 3.5 g/m$^2$, the gelatin of the emulsion layer was coated in an amount of 0.8 g/m$^2$, and the silver halide of the emulsion layer was coated in an amount calculated on silver nitrate of 1.0 g/m$^2$. In the undercoat layer and the emulsion layer, formalin was contained in an amount of 5.0 mg/1 g of gelatin. After drying, the supports were heated at 40° C. for 10 days, and then a nucleus-coating solution described in Plate No. 31 of Example 2 of Japanese Provisional Patent Publication No. 103104/1979 was coated on the respective emulsion layers, followed by drying, to prepare lithographic printing plates.

The silver halide emulsion was obtained by adding 4×10$^{-6}$ mole of rhodium chloride per 1 mole of silver halide at the time of physical aging and had an average particle size of 0.4 $\mu$m. The lithographic printing plates having a width of 404 mm and a length of 500 mm were used. A thin line image was exposed to said lithographic printing plates by using a process camera having an image-reversing mechanism.

As processing solutions, the following developing solutions and stabilizing solution were used. The processing temperature of the developing solutions and the stabilizing solution were adjusted so as to be 30° C. and 25° C., respectively. The kind of Compound A in the developing solutions is shown in Table 1.

| <Developing solution> | |
|---|---|
| Potassium hydroxide | 8 g |
| Sodium hydroxide | 24 g |
| Anhydrous sodium. sulfite | 50 g |
| 2-Aminoethyl-aminoethanol | 10 g |
| Oleophilic property-imparting agent | 0.2 g |
| Compound A | $2 \times 10^{-3}$ mole |

Made up to 1 liter with addition of water. The pH was adjusted to 13.4. The oleophilic property-imparting agent is 2-mercapto-5-n-heptyloxadiazole.

| <Stabilizing solution> | |
|---|---|
| Phosphoric acid | 1.2 g |
| Sodium primary phosphate | 25 g |
| Anhydrous sodium sulfite | 2.5 g |
| Ethylene glycol | 5 g |
| Oleophilic property-imparting agent | 0.1 g |
| Diethanolamine | 5 g |

Made up to 1 liter with addition of water. The pH was adjusted to 6. The oleophilic property-imparting agent is 2-mercapto-5-n-heptyloxadiazole.

As an automatic developing apparatus, a processing unit in a commercially available camera processor CP-414S (trade name, manufactured by Mitsubishi Paper Mills, Limited, Japan and Dainippon Screen Seizo Co., Japan) for a DTR lithographic printing plate was used. A development processing tank (volume: 7 liter) was filled with the above developing solution, a stabilizing processing tank (volume: 6 liter) was filled with the above stabilizing solution, and 100 plates were processed.

The state of generation of silver sludge when 50 plates and 100 plates were processed, and the printing characteristics of the prepared lithographic printing plates (the 100th plates) were evaluated. The results are shown in Table 1.

The state of generation of silver sludge was evaluated based on the following standard.
A: Silver sludge is not generated.
B: Silver sludge is slightly deposited at the bottom of a developing tank.
C: Silver sludge is considerably deposited at the bottom of a developing tank.
D: A large amount of silver sludge is deposited at the bottom of a developing tank, and silver sludge is also adhered to squeezing rollers.
E: A considerable amount of silver sludge is adhered to squeezing rollers, and silver sludge is transferred onto the surface of a lithographic printing plate after processing.

A printing test was carried out as described below. The printing plates were set in an offset printing press (AB-Dick 365, trade name, manufactured by AB-Dick Co.). AB-Dick 3-1012 Black ink (trade name, produced by AB-Dick Co.) was used as an ink, OD30 (trade name, damping water produced by Mitsubishi Paper Mills Limited, Japan) was used as damping water, etching was carried out by using tap water, and printing was carried out.

Ink receptivity was evaluated by the number of printing sheets until a print having good image density without unevenness of density was obtained after feeding of sheets was started simultaneously with touching the ink to the plate surface.

Printing endurance was evaluated based on the following standard.
A: Thin lines with a width of 100 μm are not lacked even when 20,000 sheets are printed.
B: Thin lines with a width of 100 μm are lacked when 15,000 sheets are printed.
C: Thin lines with a width of 100 μm are lacked when 10,000 sheets are printed.
D: Thin lines with a width of 100 μm are lacked when 5,000 sheets are printed.

TABLE 1

| | | State of generation of silver sludge | | | |
|---|---|---|---|---|---|
| | Compound A | 50th plate | 100th plate | Ink receptivity | Printing endurance |
| Comparative sample 1 | None | C | D | 35 | A |
| Comparative sample 2 | Comparative A | A | A | 100 | C |
| Comparative sample 3 | Comparative B | A | A | 80 | C |
| Comparative sample 4 | Comparative C | B | C | 50 | B |
| Comparative sample 5 | Comparative D | C | D | 40 | A |
| Comparative sample 6 | Comparative E | C | D | 45 | B |
| Present sample 1 | Compound of the formula (2) | A | A | 11 | A |
| Present sample 2 | Compound of the formula (3) | A | A | 10 | A |
| Present sample 3 | Compound of the formula (5) | A | A | 11 | A |
| Present sample 4 | Compound of the formula (4) | A | B | 15 | A |
| Present sample 5 | Compound of the formula (7) | A | B | 16 | A |

Comparative Compounds

Comparative A: 2-Mercaptobenzothiazole-5-sulfonic acid
Comparative B: Bisphenylacetic acid-2-disulfide
Comparative C: Tetrabutylammonium-bromide
Comparative D: Compound of the following formula (16)
Comparative E: Compound of the following formula (17)

$$HO-CH_2CH_2-S-CH_2CH_2OH \qquad (16)$$

$$HOOCCH_2CH_2-S-CH_2CH_2-S-CH_2CH_2COOH \qquad (17)$$

From the above results, it can be seen that when the developing solution containing no silver sludge-preventing agent is used, silver sludge is remarkably generated, and ink receptivity is lowered by running processing. The compounds of the present invention prevent generation of silver sludge without lowering printing characteristics. On the other hand, it can be seen that some of the comparative compounds do not have an effect on suppression of silver sludge, or some of the comparative compounds have said effect, but printing characteristics are lowered. Further, when the developing solution containing a quaternary ammonium salt was used, ground toning at non-image portions was observed. With respect to the ink receptivity of the first plate of Comparative sample 1 (using the developing solution containing no silver sludge-preventing agent), the number of printing sheets was 12, which is not shown in Table 1, and ink receptivity was lowered by running processing. The ink receptivities of the present samples were stable irrespectively of running processing.

Example 2

As a developing apparatus, the coating processing apparatus of FIG. 1 was used. The same developing solutions used in Example 1 except for changing the amount of Compound A to $2 \times 10^{-3}$ mole and $8 \times 10^{-3}$ moles were used. With respect to the state of generation of silver sludge, the degrees of precipitation of the intermediate tank (volume: 800 ml) and the squeezing rollers when 100 plates were processed were evaluated based on the evaluation standard of Example 1. In order that the amount of the developing solution in the intermediate tank was always constant, processing was carried out while a new developing solution was replenished in an amount corresponding to a reduced amount. Printing characteristics (100th plates) were evaluated in the same manner as in Example 1. The evaluation results are shown in Table 2.

TABLE 2

| | | Generation of silver sludge | | Ink receptivity | | Printing endurance | |
|---|---|---|---|---|---|---|---|
| | Compound A | $2 \times 10^{-3}$ | $8 \times 10^{-3}$ | $2 \times 10^{-3}$ | $8 \times 10^{-3}$ | $2 \times 10^{-3}$ | $8 \times 10^{-3}$ |
| Comparative sample 1 | None | E | | 45 | | A | |
| Comparative sample 2 | Comparative A | B | A | 110 | 155 | C | D |
| Comparative sample 3 | Comparative B | B | A | 95 | 120 | C | D |
| Comparative sample 4 | Comparative C | D | C | 55- | 75 | B | C |
| Comparative sample 5 | Comparative D | E | D | 50 | 65 | A | B |
| Comparative sample 6 | Comparative E | E | D | 60 | 80 | B | C |
| Present sample 1 | Compound of the formula (2) | B | *A | 11 | 13 | A | A |
| Present sample 2 | Compound of the formula (3) | B | A | 11 | 14 | A | A |
| Present sample 3 | Compound of the formula (5) | *B | A | 12 | 14 | A | A |
| Present sample 4 | Compound of the formula (4) | C | A | 16 | 20 | A | A |
| Present sample 5 | Compound of the formula (7) | C | A | 16 | 21 | A | A |

From the above results, it can be seen that as compared with the conventional silver sludge-preventing agents (Comparative compounds), even when large amounts of the compounds of the present invention are used, physical development and the ink receptivity of silver image portions are not inhibited. Therefore, the present invention is particularly effective for the coating processing system in which silver sludge is easily generated. With respect to the ink receptivity of the first plate of Comparative sample 1, the number of printing sheets was 13, which is not shown in Table 2, and ink receptivity was lowered by running processing. The ink receptivities of the first plates and the 100th plates of the present samples were not different.

Example 3

Procedures were carried out in the same manner as in Example 1 except for using the following developing solution and stabilizing solutions.

| <Developing solution> | |
|---|---|
| Potassium hydroxide | 8 g |
| Sodium hydroxide | 24 g |
| Anhydrous sodium sulfite | 50 g |

| -continued | |
|---|---|
| <Developing solution> | |
| 2-Aminoethyl-aminoethanol | 10 g |
| Oleophilic Property-imparting agent | 0.2 g |

Made up to 1 liter with addition of water. The pH was adjusted to 13.4. The oleophilic property-imparting agent is 2-mercapto-5-n-heptyloxadiazole.

| <Stabilizing solution> | |
|---|---|
| Phosphoric acid | 1.2 g |
| Sodium primary phosphate | 25 g |
| Anhydrous sodium sulfite | 2.5 g |
| Ethylene giycoi | 5 g |
| Oieophilic property-imparting agent | 0.1 g |
| Diethanolamine | 5 g |
| Compound A | $2 \times 10^{-3}$ mole |

Made up to 1 liter with addition of water. The pH was adjusted to 6. The oleophilic property-imparting agent is 2-mercapto-5-n-heptyloxadiazole. Compound A was added as a silver sludge-preventing agent and specifically shown in Table 3.

As an automatic developing apparatus, a processing unit in a commercially available camera processor CP-414S (trade name, manufactured by Mitsubishi Paper Mills Limited, Japan and Dainippon Screen Manufacture Co., Japan) for a DTR lithographic printing plate was used. A development processing tank (volume: 7 liter) was filled with the above developing solution, a stabilizing processing tank (volume: 6 liter) was filled with the above stabilizing solution, and 100 plates were processed.

The state of generation of silver sludge when 50 plates and 100 plates were processed in the stabilizing step, and the printing characteristics of the prepared lithographic printing plates (the 100th plates) were evaluated. The results are shown in Table 3.

The state of generation of silver sludge was evaluated based on the following standard.
A: Silver sludge is not generated.
B: The stabilizing solution becomes turbid.
C: Silver sludge is slightly deposited at the bottom of a processing tank.
D: Silver sludge is considerably deposited at the bottom of a processing tank.
E: Silver sludge is adhered to squeezing rollers, and silver sludge is transferred onto the surface of a lithographic printing plate after processing.

Ink receptivity was evaluated in the same manner as in Example 1. The results are shown in Table 3.

From the above results, the compounds of the present invention inhibit generation of silver sludge in the stabilizing solutions without lowering ink receptivity even in running processing. However, in the stabilizing solution containing no silver sludge-preventing agent, a large amount of silver sludge is generated, and ink receptivity is lowered by running processing. On the other hand, it can be seen that some of the comparative compounds do not have an effect on suppression of silver sludge, or some of the comparative compounds have said effect, but ink receptivity is remarkably lowered. With respect to the ink receptivity of the first plate of Comparative sample 1 to which no silver sludge-preventing agent is added, the number of printing sheets was 12, which is not shown in Table 3, and silver sludge was generated by running processing to lower ink receptivity.

TABLE 3

|  | Compound A | State of generation of silver sludge | | Ink receptivity |
|---|---|---|---|---|
|  |  | 50th plate | 100th plate |  |
| Comparative sample 1 | None | C | D | 30 |
| Comparative sample 2 | Comparative A | A | B | 110 |
| Comparative sample 3 | Comparative B | A | B | 90 |
| Comparative sample 4 | Comparative C | B | C | 45 |
| Comparative sample 5 | Comparative D | C | D | 35 |
| Comparative sample 6 | Comparative E | C | D | 40 |
| Present sample 1 | Compound of the formula (2) | A | A | 12 |
| Present sample 2 | Compound of the formula (3) | A | A | 12 |
| Present sample 3 | Compound of the formula (5) | A | A | 13 |
| Present sample 4 | Compound of the formula (4) | A | B | 16 |
| Present sample 5 | Compound of the formula (7) | A | B | 17 |

Example 4

As a developing apparatus, the coating processing apparatus of FIG. 1 was used. The same developing solution and stabilizing solutions used in Example 3 except for changing the amount of Compound A in the stabilizing solutions to $2 \times 10^{-3}$ mole and $8 \times 10^{-3}$ moles were used. With respect to the state of generation of silver sludge, the degrees of precipitation of the intermediate tank (volume: 800 ml) and the squeezing rollers when 100 plates were processed were evaluated based on the evaluation standard of Example 3. In order that the amount of the stabilizing solution in the intermediate tank was always constant, processing was carried out while a new stabilizing solution was replenished in an amount corresponding to a reduced amount. The ink receptivities of 100th plates were evaluated in the same manner as in Example 1. The evaluation results are shown in Table 4.

TABLE 4

|  | Compound A | Generation of silver sludge | | Ink receptivity | |
|---|---|---|---|---|---|
|  |  | $2 \times 10^{-3}$ | $8 \times 10^{-3}$ | $2 \times 10^{-3}$ | $8 \times 10^{-3}$ |
| Comparative sample 1 | None | E | | 50 | |
| Comparative sample 2 | Comparative A | C | B | 115 | 175 |
| Comparative sample 3 | Comparative B | C | B | 105 | 140 |
| Comparative sample 4 | Comparative C | D | C | 60 | 80 |
| Comparative sample 5 | Comparative D | E | D | 55 | 70 |
| Comparative sample 6 | Comparative E | E | D | 65 | 90 |
| Present sample 1 | Compound of the formula (2) | B | A | 12 | 15 |
| Present sample 2 | Compound of the formula (3) | B | A | 13 | 16 |
| Present sample 3 | Compound of the formula (5) | B | A | 12 | 16 |

TABLE 4-continued

|  | Compound A | Generation of silver sludge | | Ink receptivity | |
|---|---|---|---|---|---|
|  |  | $2 \times 10^{-3}$ | $8 \times 10^{-3}$ | $2 \times 10^{-3}$ | $8 \times 10^{-3}$ |
| Present sample 4 | Compound of the formula (4) | C | A | 17 | 22 |
| Present sample 5 | Compound of the formula (7) | C | A | 18 | 23 |

From the above results, it can be seen that as compared with the conventional silver sludge-preventing agents (Comparative compounds), even when large amounts of the compounds of the present invention are used, the ink receptivity of silver image portions is not inhibited. Therefore, the present invention is particularly effective for the coating processing system in which silver sludge is easily generated. With respect to the ink receptivity of the first plate of Comparative sample 1, the number of printing sheets was 13, which is not shown in Table 4, and ink receptivity was lowered by running processing. The ink receptivities of the first plates and the 100th plates of the present samples were not different.

According to the present invention, in development processing of a lithographic printing plate utilizing the silver complex diffusion transfer process, generation of silver sludge in processing solutions for plate making (a developing solution and a stabilizing solution) can be prevented without inhibiting physical development and the ink receptivity of silver image portions. Therefore, even in running processing, stable printing characteristics can be provided. The present invention is particularly effective for the coating processing system in which silver sludge is easily generated.

I claim:

1. In a process for making a lithographic printing plate utilizing the silver complex diffusion transfer process by subjecting the lithographic printing plate, including a support, a silver halide emulsion layer and a physical development nuclei layer, to exposure and then development processing, the improvement comprising:

performing the development processing by using a developing solution containing a monothioether compound containing succinic acid, a salt thereof or a succinic acid derivative selected from the group consisting of an ester in which a hydrogen atom of a carboxy group is substituted, an amide in which a hydroxyl group of a carboxy group is substituted, and an acid anhydride.

2. The process according to claim 1, wherein the monothioether compound is a compound represented by the formula (1):

wherein $A^1$ and $A^2$ each represent $OM^1$, $N(R^2R^3)$ or $OR^4$ where $M^1$ represents a cation, $R^2$ and $R^3$ each represent a hydrogen atom or an alkyl group, and $R^4$ represents an alkyl group or an aryl group, or may be an acid anhydride in which two carboxy groups are dehydrated; L represents an alkylene group; n represents 0 or 1; and $R^1$ represents an alkyl group.

3. The process according to claim 2, wherein $A^1$ and $A^2$ are both $OM^1$ where $M^1$ is a cation.

4. The process according to claim 2, wherein $R^1$ is an alkyl group having 1 to 4 carbon atoms substituted by a carboxy group or a salt thereof.

5. The process according to claim 2, wherein the monothioether compound is at least one selected from the group consisting of:

6. The process according to claim 2, wherein the monothioether compound is at least one selected from the group consisting of:

$$HOOC-CH_2CH_2-S-\underset{\underset{CH_2COOH}{|}}{CH}COOCH_3 \quad (4)$$

$$\underset{\underset{HOOCCH_2}{|}}{CH_3-CH}-S-\underset{\underset{CH_2COOH}{|}}{CH_2CHCOOH} \quad (5)$$

$$HO-CH_2CH_2-S-\underset{\underset{CH_2COOH}{|}}{CH}COOH \quad (7)$$

7. The process according to claim 2, wherein the monothioether compound is contained in the developing solution in an amount of $10^{-5}$ to $10^{-1}$ mole/liter.

8. The process according to claim 2, wherein the monothioether compound is contained in the developing solution in an amount of $10^{-4}$ to $10^{-2}$ mole/liter.

9. The process according to claim 1, wherein the developing solution contains an oleophilic property-imparting agent.

10. The process according to claim 9, wherein the oleophilic property-imparting agent is a compound having a mercapto group or a thion group.

11. The process according to claim 10, wherein the compound having a mercapto group or a thion group is a compound represented by the formula (15):

wherein $R^1$ and $R^3$ each independently represent an alkyl group, an alkenyl group, an aralkyl group or an aryl group; $R^2$ represents a hydrogen atom, an alkyl group, an alkenyl group, an aralkyl group or an aryl group; m and n each represent an integer of 1 or more, and when $R^2$ is an alkyl group, an alkenyl group, an aralkyl group or an aryl group, n may be 0; and Z represents atomic groups necessary for forming a 5- or 6-membered ring together with N and C in the formula.

12. The process according to claim 11, wherein Z forms, with N and C, a 5- or 6-membered ring selected from the group consisting of imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine rings, which may be produced by condensing two or more rings or fused with a benzene ring or a naphthalene ring.

13. The process according to claim 11, wherein the compound having a mercapto group or a thione group is a compound selected from the group consisting of 2-mercapto-4-phenylimidazole, 2-mercapto-1-benzylimidazole, 2-mercapto-1-butyl-benzimidazole, 1,3-dibenzyl-imidazolidine-2-thione, 2-mercapto-4-phenylthiazole, 3-butyl-benzothiazoline-2-thione, 3-dodecyl-benzothiazoline-2-thione, 2-mercapto-4,5-diphenyloxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 5-mercapto-1-phenyltetrazole, 3-mercapto-4-methyl-6-phenyl-pyridazine, 2-mercapto-5,6-diphenyl-pyrazine, 2-mercapto-4,6-diphenyl-1,3,5-triazine and 2-amino-4-mercapto-6-benzyl-1,3,5-triazine.

14. The process according to claim 11, wherein the compound having a mercapto group or a thion group is contained in the developing solution in an amount of 0.01 to 1 g per liter of the developing solution.

15. The process according to claim 1, wherein the development processing is performed by coating the developing solution on the lithographic printing plate.

16. In a process for making a lithographic printing plate utilizing the silver complex diffusion transfer process by subjecting the lithographic printing plate, including a support, a silver halide emulsion layer and a physical development nuclei layer, to exposure and then development processing and stabilizing processing, the improvement comprising:

performing the stabilizing processing by using a stabilizing solution containing a monothioether compound containing succinic acid, a salt thereof or a succinic acid derivative selected from the group consisting of an ester in which a hydrogen atom of a carboxy group is substituted, an amide in which a hydroxyl group of a carboxy group is substituted, and an acid anhydride.

17. The process according to claim 16, wherein the monothioether compound is a compound represented by the formula (1):

$$R^1-S-(L)_n-\underset{\underset{CH_2COA^2}{|}}{CH}COA^1 \quad (1)$$

wherein $A^1$ and $A^2$ each represent $OM^1$, $N(R^2R^3)$ or $OR^4$ where $M^1$ represents a cation, $R^2$ and $R^3$ each represent a hydrogen atom or an alkyl group, and $R^4$ represents an alkyl group or an aryl group, or may be an acid anhydride in which two carboxy groups are dehydrated; L represents an alkylene group; n represents 0 or 1; and $R^1$ represents an alkyl group.

18. The process according to claim 17, wherein $A^1$ and $A^2$ are both $OM^1$ where $M^1$ is a cation.

19. The process according to claim 17, wherein $R^1$ is an alkyl group having 1 to 4 carbon atoms substituted by a carboxy group or a salt thereof.

20. The process according to claim 17, wherein the monothioether compound is at least one selected from the group consisting of:

$$HOOC-CH_2CH_2-S-\underset{\underset{CH_2COOH}{|}}{CH}COOH \quad (2)$$

$$NaOOC-CH_2CH_2-S-\underset{\underset{CH_2COONa}{|}}{CH}COONa \quad (3)$$

$$HOOC-CH_2CH_2-S-\underset{\underset{CH_2COOH}{|}}{CH}COOCH_3 \quad (4)$$

$$\underset{\underset{HOOCCH_2}{|}}{CH_3-CH}-S-\underset{\underset{CH_2COOH}{|}}{CH_2CHCOOH} \quad (5)$$

$$\underset{\underset{HOOCCH_2}{|}}{HOOCCH-CH_2}-S-\underset{\underset{CH_2COOH}{|}}{CH}COOH \quad (6)$$

$$HO-CH_2CH_2-S-\underset{\underset{CH_2COOH}{|}}{CH}COOH \quad (7)$$

$$HOOC-CH_2CH_2-S-\underset{\underset{CH_2CO}{|}}{CH}CO\diagdown_O \quad (8)$$

-continued

21. The process according to claim 17, wherein the monothioether compound is at least one selected from the group consisting of:

22. The process according to claim 17, wherein the monothioether compound is contained in the stabilizing solution in an amount of $10^{-5}$ to $10^{-1}$ mole/liter.

23. The process according to claim 17, wherein the monothioether compound is contained in the stabilizing solution in an amount of $10^{-4}$ to $10^{-2}$ mole/liter.

24. The process according to claim 16, wherein the stabilizing solution contains an oleophilic property-imparting agent.

25. The process according to claim 24, wherein the oleophilic property-imparting agent is a compound having a mercapto group or a thion group.

26. The process according to claim 25, wherein the compound having a mercapto group or a thion group is a compound represented by the formula (15):

wherein $R^1$ and $R^3$ each independently represent an alkyl group, an alkenyl group, an aralkyl group or an aryl group; $R^2$ represents a hydrogen atom, an alkyl group, an alkenyl group, an aralkyl group or an aryl group; m and n each represent an integer of 1 or more, and when $R^2$ is an alkyl group, an alkenyl group, an aralkyl group or an aryl group, n may be 0; and Z represents atomic groups necessary for forming a 5- or 6-membered ring together with N and C in the formula.

27. The process according to claim 16, wherein the development processing is performed by coating a developing solution on the lithographic printing plate, and the stabilizing processing is performed by coating the stabilizing solution on the lithographic printing plate.

\* \* \* \* \*